(12) United States Patent
Kurahashi et al.

(10) Patent No.: US 6,794,687 B1
(45) Date of Patent: Sep. 21, 2004

(54) SEMICONDUCTOR LIGHT-EMITTING DEVICE AND METHOD FOR FABRICATING THE DEVICE

(75) Inventors: Takahisa Kurahashi, Kashiba (JP); Hiroshi Nakatsu, Tenri (JP); Hiroyuki Hosoba, Kyoto-fu (JP); Tetsurou Murakami, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/645,571

(22) Filed: Aug. 25, 2000

(30) Foreign Application Priority Data

Aug. 25, 1999 (JP) ........................................... 11-238225

(51) Int. Cl.[7] .............................................. H01L 33/00
(52) U.S. Cl. ........................................ 257/98; 257/95
(58) Field of Search ....................... 257/98, 95; 372/102

(56) References Cited

U.S. PATENT DOCUMENTS

| | | | |
|---|---|---|---|
| 5,226,053 A | | 7/1993 | Cho et al. |
| 5,255,278 A | * | 10/1993 | Yamanaka .................... 372/45 |
| 5,392,307 A | * | 2/1995 | Sugiyama et al. ............. 372/45 |
| 5,426,657 A | * | 6/1995 | Vakhshoori .................... 372/45 |
| 5,428,634 A | * | 6/1995 | Bryan et al. .................... 372/45 |
| 5,491,710 A | * | 2/1996 | Lo .................................. 372/45 |
| 5,555,255 A | * | 9/1996 | Kock et al. .................... 372/96 |
| 5,779,924 A | * | 7/1998 | Krames et al. ................ 216/24 |
| 5,966,399 A | * | 10/1999 | Jiang et al. .................... 372/96 |
| 6,055,262 A | * | 4/2000 | Cox et al. ...................... 372/96 |
| 6,167,071 A | * | 12/2000 | Hayakawa ..................... 372/45 |
| 6,167,072 A | * | 12/2000 | Zory, Jr. ........................ 372/46 |
| 6,350,997 B1 | * | 2/2002 | Saeki ........................... 257/102 |
| 6,504,180 B1 | * | 1/2003 | Heremans et al. ............. 257/98 |

FOREIGN PATENT DOCUMENTS

| | | |
|---|---|---|
| JP | 6-291368 | 10/1994 |
| JP | B2-2744503 | 2/1998 |
| JP | 2000-106454 | 4/2000 |

OTHER PUBLICATIONS

Lott et al., "Visible (660 nm) Resonant Cavity Light–Emitting Diodes," Electronic Letters, Feb. 18, 1993, vol. 29, No. 4, pp. 328–329.*
Lott et al., "AlGaInP Visible Resonant Cavity Light–Emitting Diodes," IEEE Photonics Technology Letters, vol. 5, No. 6, Jun. 1994, pp. 631–633.).*
Streubel et al, "High Brightness Visible (660 nm) Resonant–Cavity Light–Emitting Diode", IEEE Photonics Technology Letters, vol. 10, No. 12, Dec. 1998, pp. 1685–1687.

* cited by examiner

Primary Examiner—Bradley Baumeister
(74) Attorney, Agent, or Firm—Nixon & Vanderhye P.C.

(57) ABSTRACT

An n-type AlAs/n-type $Al_{0.5}Ga_{0.5}As$ DBR layer and a p-type $(Al_{0.2}Ga_{0.8})_{0.5}In_{0.5}P$/p-type $Al_{0.5}In_{0.5}P$ DBR layer are formed on an n-type GaAs substrate at specified intervals so that a reflection spectrum is centered at 650 nm and the resonance wavelength becomes 650 nm. A quantum well active layer (light-emitting layer) is formed so that the light emission peak wavelength becomes 650 nm in the belly position of the standing wave generated in a resonator constructed of both the DBR layers. A grating pattern is formed on the surface of a p-type $Al_{0.5}Ga_{0.5}As$ light diffusion layer that serves as a light-emitting surface surrounded by a p-type electrode. By thus roughening the light-emitting surface, light emitted from the light-emitting layer is diffused in various directions, reducing the radiation angle dependency of the emission light wavelength.

11 Claims, 17 Drawing Sheets

SEMICONDUCTOR LIGHT-EMITTING DEVICE AND METHOD FOR FABRICATING THE DEVICE

BACKGROUND OF THE INVENTION

The present invention relates to a semiconductor light-emitting device for transmission use (in particular, for IEEE 1394), display use and the like and a method for fabricating the device.

In recent years, semiconductor light-emitting devices are broadly used for optical communications and display panels. It is important for the semiconductor light-emitting devices for the above uses to have a high light emission efficiency, and it is further important for semiconductor devices for optical communications to have a high speed of response. Such devices have been actively developed lately.

The normal plane emission type LED's (light-emitting diodes) have an insufficient high-speed response, which is limited to about 100 Mbps to 200 Mbps. Accordingly, there is developed a semiconductor light-emitting device called the resonant-cavity type LED. This resonant-cavity type LED is a semiconductor light-emitting device that achieves a high-speed response and high efficiency by controlling the natural emission light with a light-emitting layer placed in a belly position of a standing wave generated by a resonator formed of two mirrors (Japanese Patent Publication No. HEI 10-2744503, U.S. Pat. No. 5,226,053).

In particular, POF (plastic optical fiber) has lately started being utilized for communications in a relatively short range, and there has been developed a resonant-cavity type LED having a light-emitting layer made of an AlGaInP based semiconductor material capable of emitting with high efficiency light at a wavelength of 650 nm around which the POF has a small loss (High Brightness Visible Resonant Cavity Light Emitting Diode: IEEE PHOTONICS TECHNOLOGY LETTERS Vol. 10, No. 12, DECEMBER 1998).

However, the aforementioned conventional resonant-cavity type LED has the problems as follows. In detail, the conventional resonant-cavity type LED has characteristics such that a resonant wavelength λ1 in the perpendicular direction and a resonant wavelength λ2 in a slanting direction have a magnitude relation of λ1>λ2 and a peak wavelength is varied depending on the angle of radiation from the LED chip. Normally, this radiation angle dependency is about 0.2 nm/deg to 0.3 nm/deg. This causes a problem that the color is varied depending on the angle of view when the LED chip is used for display.

When using the aforementioned LED chip for communications or as a light source for communications by means of, for example, a plastic fiber, an LED chip fabricated so as to have a peak at the wavelength of 650 nm at which the plastic fiber has a small loss in the perpendicular direction cannot be used in an optical system that utilizes the emission light in a slanting direction since the peak wavelength becomes shorter than 650 nm.

SUMMARY OF THE INVENTION

Accordingly, the object of the present invention is to provide a semiconductor light-emitting device whose emission light wavelength has a small radiation angle dependency and a method for fabricating the device.

In order to achieve the above object, there is provided a semiconductor light-emitting device having a resonator constructed of a pair of multi-layer reflection films formed with interposition of a specified interval on a GaAs substrate and a light-emitting layer formed in a belly position of a standing wave in the resonator, the device comprising:

a semiconductor layer which has one or more layers and an uppermost layer whose surface is roughened, the semiconductor layer being formed on the multi-layer reflection film located on the opposite side of the GaAs substrate with respect to the light-emitting layer.

According to the above-mentioned construction, the surface of the semiconductor light-emitting device is roughened. Therefore, as shown in FIG. 7A, light emitted from the light-emitting layer is diffused in various directions when emitted out of the surface of the semiconductor light-emitting device. As a result, the radiation angle dependency of the emission light wavelength is reduced.

In one embodiment of the present invention, the light-emitting layer is constructed of an $Al_yGa_zIn_{1-y-z}P$ ($0 \leq y \leq 1$, $0 \leq z \leq 1$) layer comprised of a single layer or a plurality of layers.

According to the above-mentioned construction, the light-emitting layer is constructed of the $Al_yGa_zIn_{1-y-z}P$ ($0 \leq y \leq 1$, $0 \leq z \leq 1$) layer comprised of a single layer or a plurality of layers. This enables the obtainment of emission light having a wavelength of 560 nm to 660 nm.

In one embodiment of the present invention, the multi-layer reflection film located on the GaAs substrate side with respect to the light-emitting layer is an $Al_xGa_{1-x}As$ ($0 \leq x \leq 1$) layer, and the multi-layer reflection film located on the opposite side of the GaAs substrate with respect to the light-emitting layer is constructed of an $Al_yGa_zIn_{1-y-z}P$ ($0 \leq y \leq 1$, $0 \leq z \leq 1$) layer.

According to the above-mentioned construction, the multi-layer reflection film located on the n-type GaAs substrate side with respect to the light-emitting layer is constructed of $Al_xGa_{1-x}As$ ($0 \leq x \leq 1$). Therefore, a difference in coefficient of thermal expansion from the GaAs substrate is small. Therefore, dislocation due to a difference between a temperature before crystal growth and a temperature after crystal growth is hard to occur. This allows the number of layers of the multi-layer reflection film to be increased and allows a high reflectance to be easily obtained.

The multi-layer reflection film located on the opposite side of the GaAs substrate with respect to the light-emitting layer is formed of $Al_yGa_zIn_{1-y-z}P$ ($0 \leq y \leq 1$, $0 \leq z \leq 1$). Therefore, the layer that has lattice matching with the GaAs substrate includes Al at a maximum rate of about 25%, which is about one-half the rate of 50% in the case where the film is formed of $Al_xGa_{1-x}As$ ($0 \leq x \leq 1$). Therefore, moisture resistance is remarkably improved.

Also, there is provided a method for fabricating a semiconductor light-emitting device having a resonator constructed of a pair of multi-layer reflection films formed with interposition of a specified interval on a GaAs substrate 1 and a light-emitting layer formed in a belly position of a standing wave in the resonator, the method comprising:

a process for forming a semiconductor layer having one or more layers on the multi-layer reflection film located on the opposite side of the GaAs substrate with respect to the light-emitting layer; and a process for roughening a surface of an uppermost layer of the semiconductor layer.

According to the above-mentioned construction, the surface of the uppermost layer of the semiconductor layer formed on the resonator constructed of a pair of multi-layer reflection films is roughened. Therefore, light emitted from the light-emitting layer is diffused in various directions when emitted out of the surface of the semiconductor light-emitting device without reducing the reflectance of the multi-layer reflection films. As a result, the radiation angle dependency of the emission light wavelength is reduced.

In one embodiment of the present invention, the roughening of the surface of the uppermost layer of the semiconductor layer is performed by forming a light-difusing pattern by photolithography and etching.

According to the above-mentioned construction, the pattern that diffuses light is formed on the surface of the uppermost layer of the semiconductor layer by photolithography and etching. With this arrangement, a high-accuracy fine pattern is formed. Therefore, the degree of surface roughening is controlled so as to reduce the radiation angle dependency of the emission light wavelength.

In one embodiment of the present invention, the roughening of the surface of the uppermost layer of the semiconductor layer is performed by abrasion.

According to the above-mentioned construction, the surface of the uppermost layer of the semiconductor layer is roughened by abrasion. This obviates the need for the complicated photolithographic process as in the case where the light diffusing pattern is formed, and a semiconductor light-emitting device is fabricated by a simpler method.

In one embodiment of the present invention, the semiconductor layer is formed of $Al_yGa_zIn_{1-y-z}P$ ($0 \leq y \leq 1$, $0 \leq z \leq 1$), and the roughening of the surface of the uppermost layer of the semiconductor layer is performed by scalding at least the semiconductor layer in hydrochloric acid.

According to the above-mentioned construction, the surface of the uppermost layer of the semiconductor layer is roughened by scalding the layer in hydrochloric acid. This obviates the need for the processes of sticking the entire wafer to another substrate, sheet or the like, holding the wafer and cleaning the wafer as in the case of the aforementioned abrasion. Therefore, a semiconductor light-emitting device is fabricated by a simpler method.

Also, there is provided a method for fabricating a semiconductor light-emitting device having a resonator constructed of a pair of multi-layer reflection films formed with interposition of a specified interval on a GaAs substrate 1 and a light-emitting layer formed in a belly position of a standing wave in the resonator, the method comprising:

a process for forming a semiconductor layer having one or more layers including an $Al_yGa_zIn_{1-y-z}P$ ($0 \leq y \leq 1$, $0 \leq z \leq 1$) layer whose lattice constant differs from the GaAs substrate by 0.5% or more on a multi-layer reflection film located on the opposite side of the GaAs substrate with respect to the light-emitting layer, thereby roughening a surface of an uppermost layer of the semiconductor layer.

According to the above-mentioned construction, the surface of the semiconductor layer formed on the multi-layer reflection film located on the opposite side of the GaAs substrate with respect to the light-emitting layer is roughened by the lattice constant difference. Through this process, the surface of the semiconductor layer is roughened only by a sequence of the crystal growth process. This obviates the need for providing a process for separately performing the roughening after the crystal growth, and a semiconductor light-emitting device is fabricated by a further simplified method.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
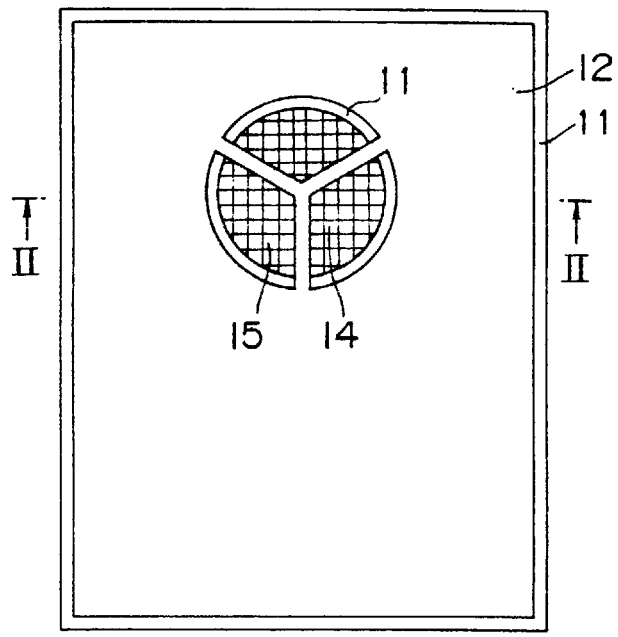
FIG. 1 is a plan view of a semiconductor light-emitting device of the present invention.

The present invention will be described in detail below on the basis of the embodiments thereof shown in the drawings.

<First Embodiment>

Figure 2:
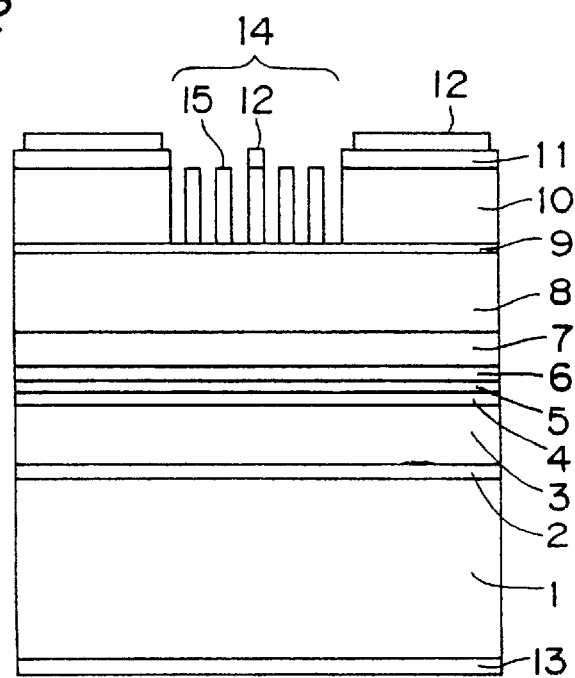
FIG. 2 is a sectional view taken along the arrow line II—II in FIG. 1.

FIG. 1 is a plan view of a semiconductor light-emitting device of the present embodiment, while FIG. 2 is a sectional view taken along the arrow line II—II in FIG. 1.

Figure 3:
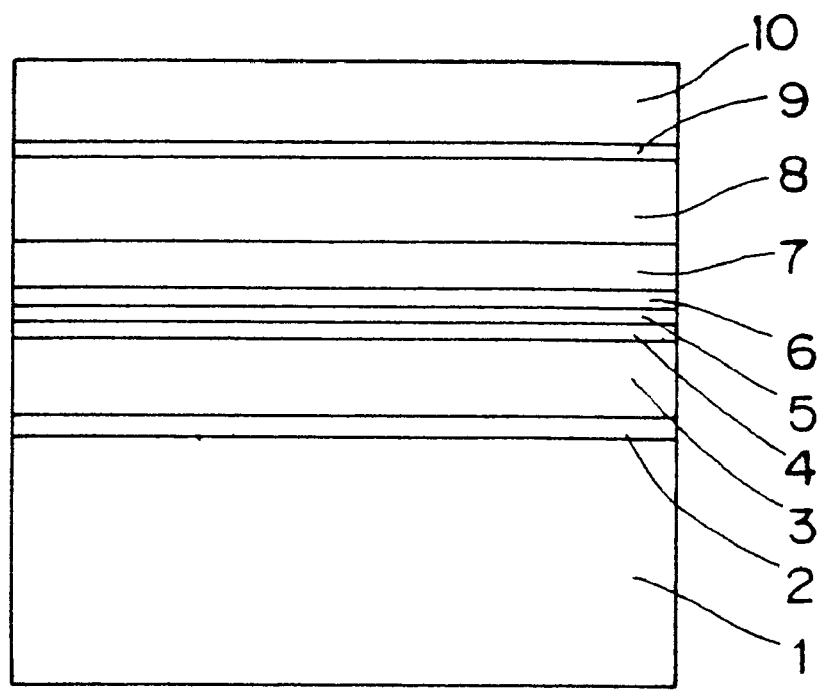
FIG. 3 is a view showing a fabricating process of the semiconductor light-emitting device shown in FIG. 2.

The semiconductor light-emitting device of the present embodiment is based on the AlGaInP system and is formed as follows. As shown in FIG. 3, an n-type GaAs buffer layer 2 having a film thickness of 1 μm, an n-type AlAs/n-type $Al_{0.5}Ga_{0.5}As$ 30-pair DBR (distributed Bragg reflector) layer 3, an n-type $(Al_{0.7}Ga_{0.3})_{0.5}In_{0.5}P$ first clad layer 4, a quantum well active layer 5, a p-type $(Al_{0.7}Ga_{0.3})_{0.5}In_{0.5}P$ second clad layer 6, a p-type $(Al_{0.2}Ga_{0.8})_{0.5}P$/p-type $Al_{0.5}In_{0.5}P$ 12-pair DBR layer 7, a p-type $Al_{0.5}Ga_{0.5}As$ current diffusion layer 8 having a film thickness of 3 μm, a p-type $(Al_{0.1}Ga_{0.9})_{0.5}In_{0.5}P$ etching stop layer 9 having a film thickness of 0.1 μm and a p-type $Al_{0.5}Ga_{0.5}As$ light diffusion layer 10 having a film thickness of 3 μm are successively laminated on an n-type GaAs substrate 1 having a surface whose normal line is inclined at an angle of 15° in the [011] direction from the (100) plane by the MOCVD (metal-organic chemical vapor deposition) method. It is to be noted that the quantum well active layer 5 has a well layer of GaInP and a barrier layer of $(Al_{0.5}Ga_{0.5})_{0.5}In_{0.5}P$.

In this case, the n-type AlAs/n-type $Al_{0.5}Ga_{0.5}As$ 30-pair DBR layer 3 and the p-type $(Al_{0.2}Ga_{0.8})_{0.5}In_{0.5}P$/p-type $Al_{0.5}In_{0.5}P$ 12-pair DBR layer 7 are formed so that the reflection spectrum is centered at a wavelength of 650 nm, and a resonator length is adjusted so that the resonance wavelength of the resonator formed of the two DBR layers 3 and 7 becomes 650 nm. In the present embodiment, the resonator length was 1.5 times the wavelength. Further, the quantum well active layer 5 is located in a belly position of a standing wave generated in the resonator, and the light emission peak wavelength is formed so as to become 650 nm.

Figure 4:
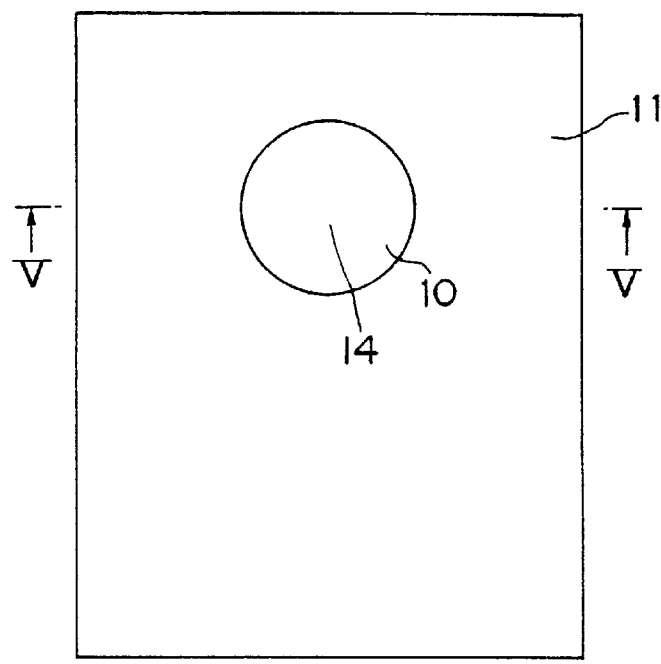
FIG. 4 is a plan view showing a fabricating process subsequent to the process of FIG. 3.
Figure 5:
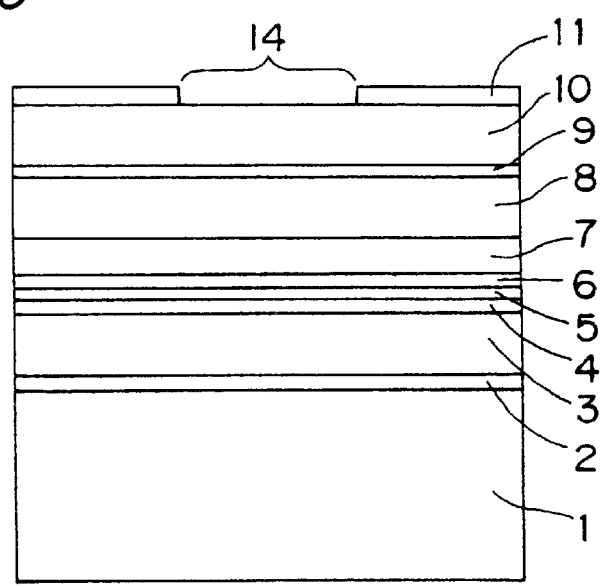
FIG. 5 is a sectional view taken along the arrow line V—V in FIG. 4.

Next, as shown in FIG. 4 and FIG. 5 (sectional view taken along the arrow line V—V in FIG. 4), an $SiO_2$ film 11 is formed on the surface of the p-type $Al_{0.5}Ga_{0.5}As$ light diffusion layer 10 by the CVD (chemical vapor deposition) method, and a circular current path 14 having a diameter of 70 μm is formed by photolithography and etching with diluted HF.

Subsequently, as shown in FIG. 1 and FIG. 2, AuZn/Mo/Au is sputtered on the p-type $Al_{0.5}Ga_{0.5}As$ light diffusion layer 10 and the $SiO_2$ film 11 and patterned by photolithography to form a surface electrode. Then, a p-type electrode 12 is formed by performing heat treatment.

Subsequently, a 5-μm pitch grating pattern 15 is formed by photolithography and sulfuric acid/hydrogen peroxide based etchant inside the circular current path 14 that belongs to the p-type $Al_{0.5}Ga_{0.5}As$ light diffusion layer 10 and is not provided with the p-type electrode 12. In this case, etching depth is controlled by performing etching until the etching reaches the p-type $(Al_{0.1}Ga_{0.9})_{0.5}In_{0.5}P$ etching stop layer 9. Then, the n-type GaAs substrate 1 is abraded to a film thickness of about 280 μm, and AuGe/Au is deposited on this abraded surface and subjected to heat treatment to form an n-type electrode 13.

Figure 6:
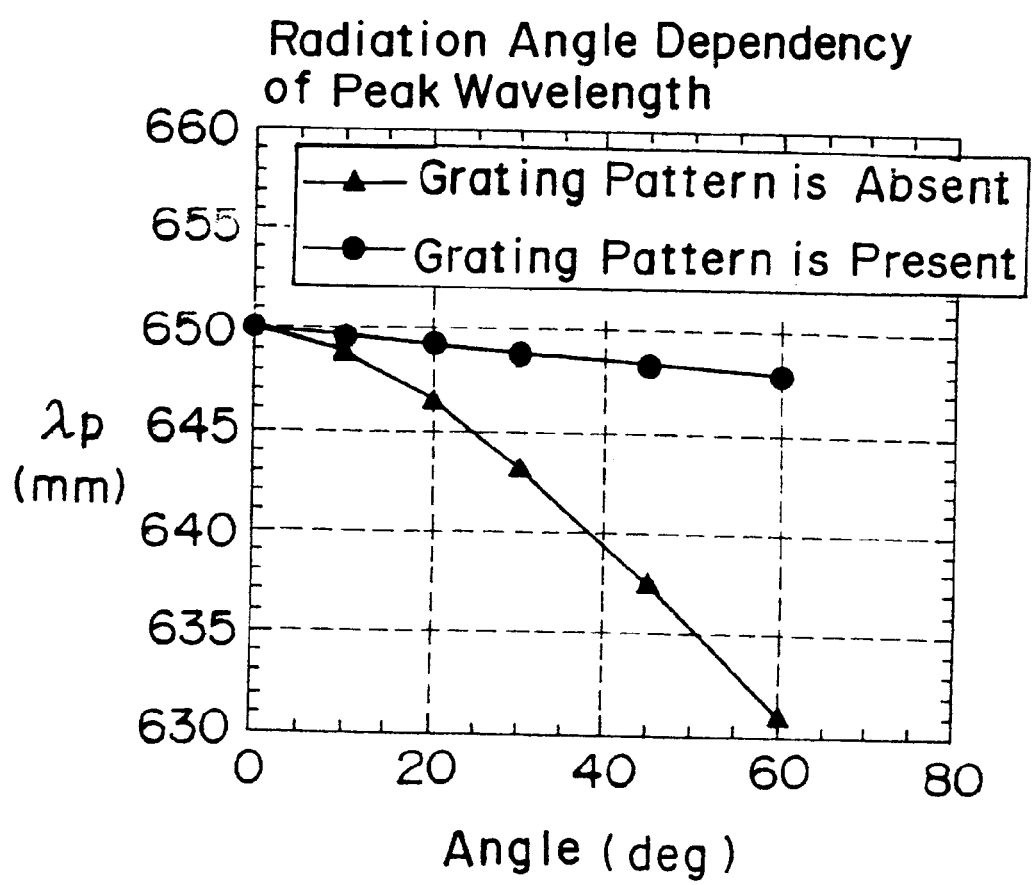
FIG. 6 is a graph showing a radiation angle dependency of the peak wavelength of the semiconductor light-emitting device shown in FIG. 1.
Figure 7A:
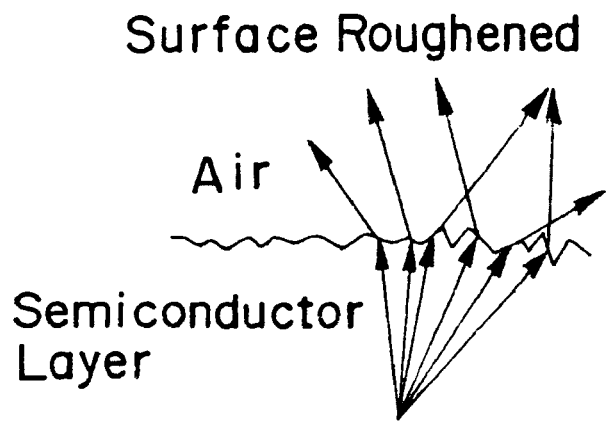
FIGS. 7A and 7B are explanatory views of an effect obtained by the surface roughening of the semiconductor light-emitting device shown in FIG. 1.
Figure 7B:
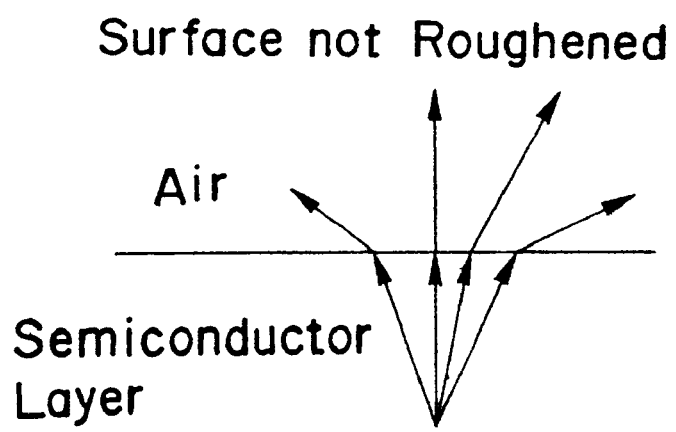

With regard to the thus-formed semiconductor light-emitting device, the grating pattern 15 is formed in the p-type $Al_{0.5}Ga_{0.5}As$ light diffusion layer 10 that serves as a light-emitting surface inside the current path 14. Therefore, as shown in FIG. 7A, light emitted from the quantum well active layer 5 that serves as a light-emitting layer is diffused in various directions when emitted to the outside. Consequently, as shown in FIG. 6, the radiation angle dependency of the emission light wavelength is made smaller than in the case where no grating pattern is formed in the p-type $Al_{0.5}Ga_{0.5}Ga_{0.5}As$ light diffusion layer 10 (corresponding to the case of FIG. 7B).

The multi-layer reflection film (n-type AlAs/n-type $Al_{0.5}Ga_{0.5}As$ DBR layer) 3 located on the n-type GaAs substrate 1 side with respect to the light-emitting layer (quantum well active layer) 5 is formed of an AlGaAs based material. Therefore, the occurrence of warp or a dark line of the n-type GaAs substrate 1 is not observed since a difference in coefficient of thermal expansion with respect to the n-type GaAs substrate 1 is small although the total film thickness is about 3 μm. Furthermore, by setting the number of layers to 30 pairs, a high reflectance of not lower than 99% is achieved.

The multi-layer reflection film (p-type $(Al_{0.2}Ga_{0.8})_{0.5}In_{0.5}P$/p-type $Al_{0.5}In_{0.5}P$ DBR layer) 7 located on the opposite side of the n-type GaAs substrate 1 with respect to the light-emitting layer (quantum well active layer) 5 is formed of an AlGaInP based material. Therefore, the layer that includes the greatest quantity of Al in the vicinity of the surface is $Al_{0.5}In_{0.5}P$, and the moisture resistance does not matter. Furthermore, the peak reflectance of this multi-layer reflection film 7 is about 70%, meaning that a sufficient reflectance is obtained as a resonant-cavity structure.

In the case of an $Al_yGa_zIn_{1-y-z}P$ ($0 \leq y \leq 1, 0 \leq z \leq 1$) multi-layer reflection film, dislocation tends to easily occur due to a difference in coefficient of thermal expansion between the layer and the n-type GaAs substrate 1 if the number of layers exceeds 20 to 30 pairs. However, in the case of the resonant-cavity type LED, the multi-layer reflection film 7 located on the opposite side of the n-type GaAs substrate 1 is not required to have a high reflectance that is required by the multi-layer reflection film 3 located on the n-type GaAs substrate 1 side. Therefore, the multi-layer reflection film 7 is not required to have layers the number of which exceeds 20 pairs, and no dislocation occurs.

The semiconductor light-emitting device of the present embodiment was subjected to an electrification test at a current of 50 mA under the conditions of a temperature of 80° and a humidity of 85%. An optical output of 90% of the initial optical output was yielded even after a lapse of 1000 hours. The present semiconductor light-emitting device has a current constriction layer, and therefore, internal quantum efficiency and external light emission efficiency are both high. With regard to the initial optical output, a high optical output of 1.6 mW was able to be obtained at a current of 20 mA.

As described above, in the present embodiment, the n-type AlAs/n-type $Al_{0.5}Ga_{0.5}As$ DBR layer 3, and the p-type $(Al_{0.2}Ga_{0.8})_{0.5}In_{0.5}P$/p-type $Al_{0.5}In_{0.5}P$ DBR layer 7 are formed with interposition of a specified interval on the n-type GaAs substrate 1 so that the reflection spectrum is centered at the wavelength of 650 nm and the resonance wavelength becomes 650 nm. Then, the quantum well active layer (light-emitting layer) 5 is located in the belly position of the standing wave generated in the resonator constructed of both the DBR layers 3 and 7 so that the emission light peak wavelength becomes 650 nm. Further, the grating pattern 15 is formed on the surface of the p-type $Al_{0.5}Ga_{0.5}As$ light diffusion layer 10 that serves as the light-emitting surface surrounded by the p-type electrode 12.

Therefore, the surface of the semiconductor light-emitting device of the present embodiment becomes a roughened surface, and the light emitted from the light-emitting layer 5 is diffused in various directions. As a result, the radiation angle dependency of the emission light wavelength can be reduced.

The quantum well active layer 5 that serves as the light-emitting layer is formed of an $Al_yGa_zIn_{1-y-z}P$ ($0 \leq y \leq 1$, $0 \leq z \leq 1$) layer constructed of a single layer or a plurality of layers. Therefore, light having a wavelength of about 560 nm to 660 nm can be emitted.

<Second Embodiment>

Figure 8:
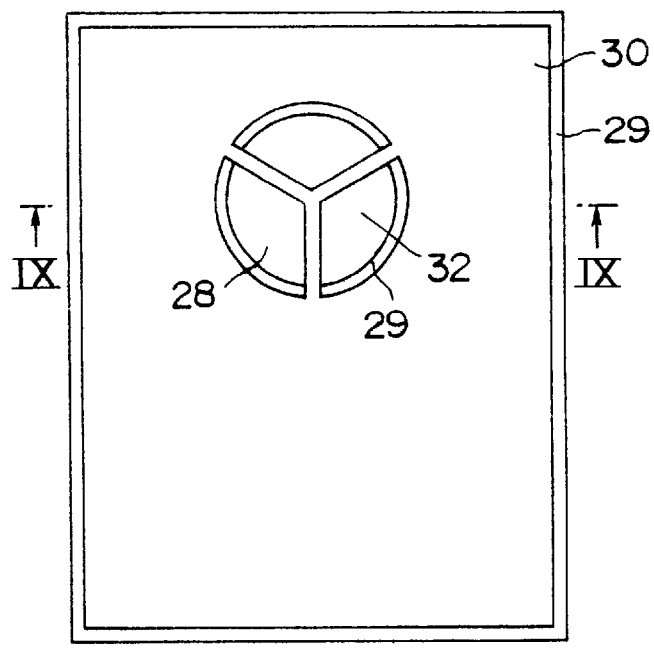
FIG. 8 is a plan view of a semiconductor light-emitting device different from that of FIG. 1.
Figure 9:
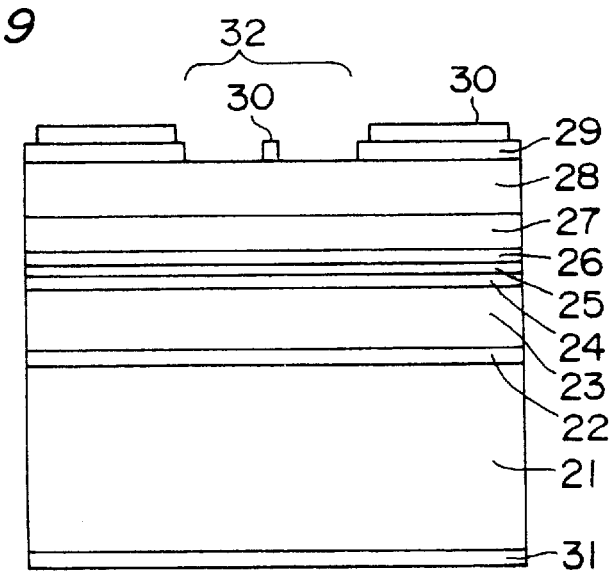
FIG. 9 is a sectional view taken along the arrow line IX—IX in FIG. 8.

FIG. 8 is a plan view of a semiconductor light-emitting device of the present embodiment, while FIG. 9 is a sectional view taken along the arrow line IX—IX in FIG. 8.

Figure 10:
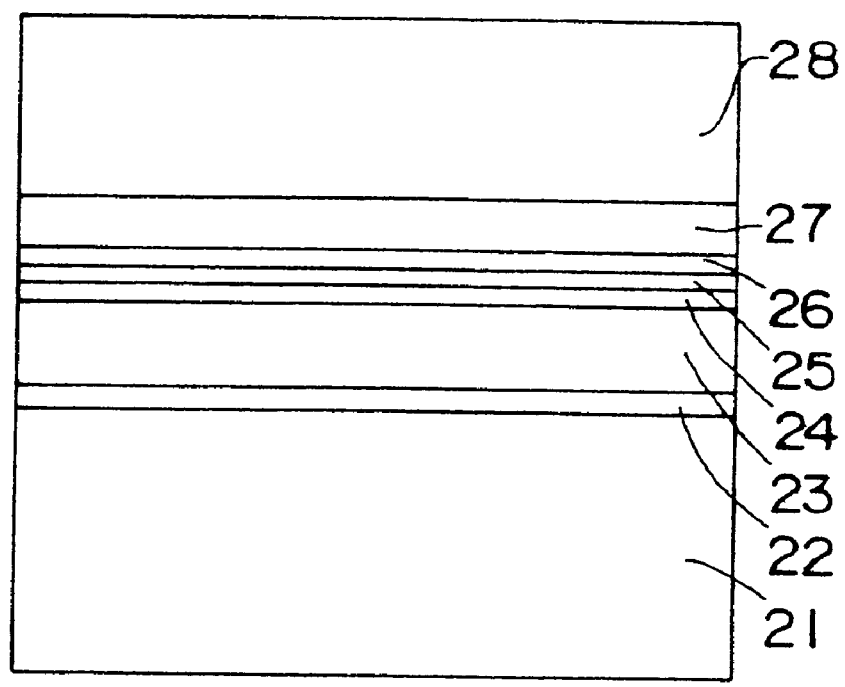
FIG. 10 is a view showing a fabricating process of the semiconductor light-emitting device shown in FIG. 9.

The semiconductor light-emitting device of the present embodiment is based on the AlGaInP system and is formed as follows. As shown in FIG. 10, an n-type GaAs buffer layer 22 having a film thickness of 1 μm, an n-type AlAs/n-type $Al_{0.5}Ga_{0.5}As$ 30-pair DBR layer 23, an n-type $(Al_{0.7}Ga_{0.3})_{0.5}In_{0.5}P$ first clad layer 24, a quantum well active layer 25, a p-type $(Al_{0.7}Ga_{0.3})_{0.5}In_{0.5}P$ second clad layer 26, a p-type $(Al_{0.2}Ga_{0.8})_{0.5}In_{0.5}P$/p-type $Al_{0.5}In_{0.5}P$ 12-pair DBR layer 27 and a p-type $Al_{0.5}Ga_{0.5}As$ current diffusion layer 28 having a film thickness of 10 μm are successively laminated on an n-type GaAs substrate 21 having a surface whose normal line is inclined at an angle of 15° in the [011] direction from the (100) plane by the MOCVD method. It is to be noted that the quantum well active layer 25 has a well layer of GaInP and a barrier layer of $(Al_{0.5}Ga_{0.5})_{0.5}In_{0.5}P$.

In this case, the n-type AlAs/n-type $Al_{0.5}Ga_{0.5}As$ 30-pair DBR layer 23 and the p-type $(Al_{0.2}Ga_{0.8})_{0.5}In_{0.5}P$/p-type $Al_{0.5}In_{0.5}P$ 12-pair DBR layer 27 are formed so that the reflection spectrum is centered at a wavelength of 650 nm, and a resonator length is adjusted so that the resonance wavelength of the resonator formed of the two DBR layers 23 and 27 becomes 650 nm. In the present embodiment, the resonator length was 1.5 times the wavelength. Further, the quantum well active layer 25 is formed so that the layer is located in the belly position of the standing wave generated in the resonator with the light emission peak wavelength set to 650 nm.

Figure 11:
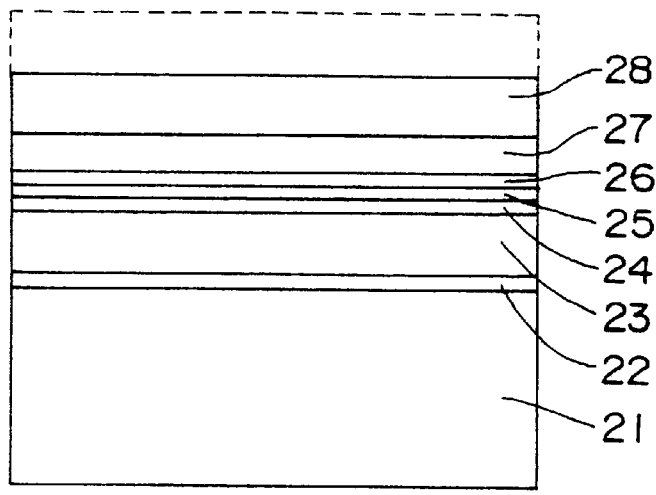
FIG. 11 is a view showing a fabricating process subsequent to the process of FIG. 10.

Subsequently, as shown in FIG. 11, the surface of the p-type $Al_{0.5}Ga_{0.5}As$ current diffusion layer 28 having a film thickness of 10 μm is abraded by several micrometers to be roughened so that the emission light diffuses.

Figure 12:
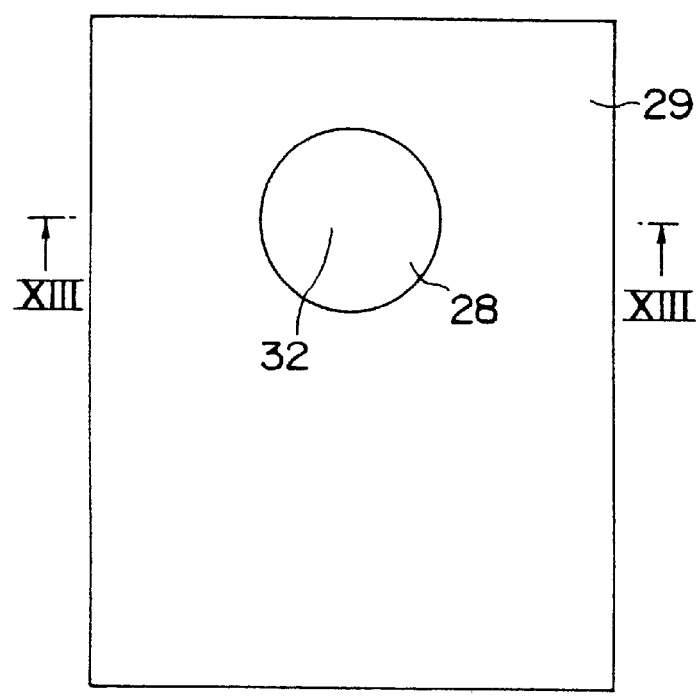
FIG. 12 is a plan view showing a fabricating process subsequent to the process of FIG. 11.
Figure 13:
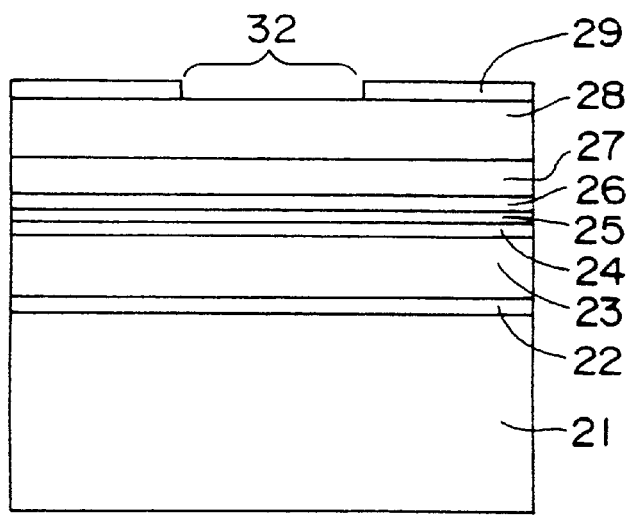
FIG. 13 is a sectional view taken along the arrow line XIII—XIII in FIG. 12.

Next, as shown in FIG. 12 and FIG. 13 (sectional view taken along the arrow line XIII—XIII in FIG. 12), an $SiO_2$ film 29 is formed on the surface of the p-type $Al_{0.5}Ga_{0.5}As$ current diffusion layer 28 by the CVD method, and a circular current path 32 having a diameter of 70 μm is formed by photolithography and etching with diluted HF.

Subsequently, as shown in FIG. 8 and FIG. 9, AuZn/Mo/Au is sputtered on the p-type $Al_{0.5}Ga_{0.5}As$ current diffusion layer 28 and the $SiO_2$ film 29 and patterned by photolithography to form a surface electrode. Then, a p-type electrode 30 is formed by performing heat treatment. Further, the n-type GaAs substrate 21 is abraded to a film thickness of about 280 μm, and AuGe/Au is deposited on this abraded surface and subjected to heat treatment to form an n-type electrode 31.

The thus-formed semiconductor light-emitting device formed needs no complicated photolithography process when forming a grating pattern on the wafer surface for the roughening of the surface and allows the processes to be simplified, by comparison with the first embodiment. It is to be noted that the radiation angle dependency of the emission light wavelength is sufficiently reduced similarly to the first embodiment.

With regard to the moisture resistance, there was no problem similarly to the first embodiment. When an electrification test was performed at a current of 50 mA under the conditions of a temperature of 80° and a humidity of 85%, an optical output of 90% of the initial optical output was yielded even after a lapse of 1000 hours. With regard to the initial optical output, a high optical output of 1.6 mW was able to be obtained at a current of 20 mA.

<Third Embodiment>

Figure 14:
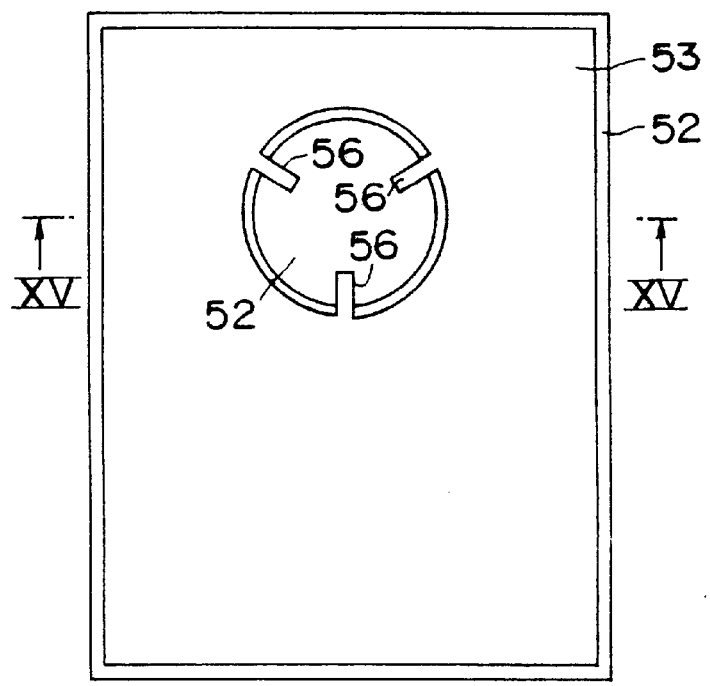
FIG. 14 is a plan view of a semiconductor light-emitting device different from those of FIG. 1 and FIG. 8.
Figure 15:
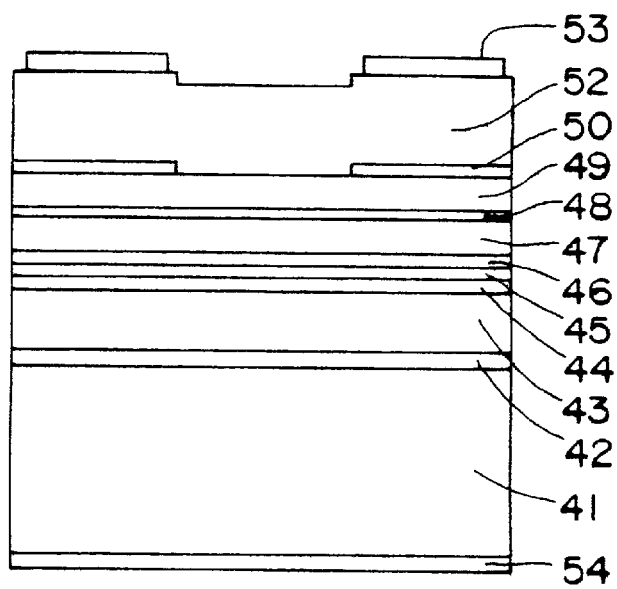
FIG. 15 is a sectional view taken along the arrow line XV—XV in FIG. 14.

FIG. 14 is a plan view of a semiconductor light-emitting device of the present embodiment, while FIG. 15 is a sectional view taken along the arrow line XV—XV in FIG. 14.

Figure 16:
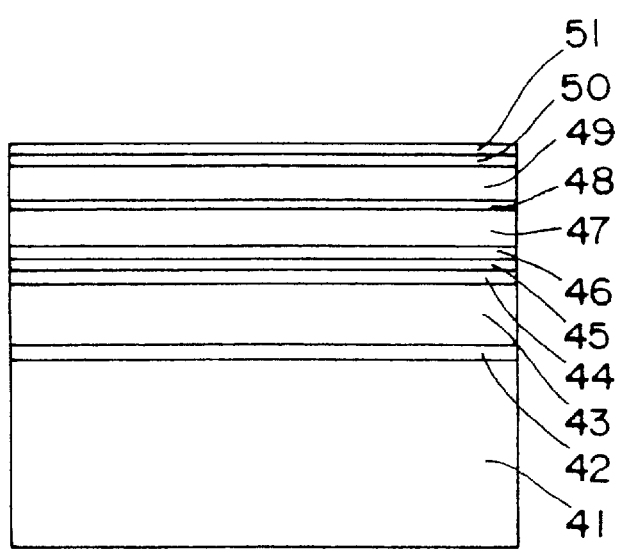
FIG. 16 is a view showing a fabricating process of the semiconductor light-emitting device shown in FIG. 15.

The semiconductor light-emitting device of the present embodiment is based on the AlGaInP system and is formed as follows. As shown in FIG. 16, an n-type GaAs buffer layer 42 having a film thickness of 1 μm, an n-type AlAs/n-type $Al_{0.7}Ga_{0.3}As$ 70-pair DBR layer 43, an n-type $(Al_{0.7}Ga_{0.3})_{0.5}In_{0.5}P$ first clad layer 44, a quantum well active layer 45, a p-type $(Al_{0.7}Ga_{0.3})_{0.5}In_{0.5}P$ second clad layer 46, a p-type $(Al_{0.4}Ga_{0.6})_{0.5}In_{0.5}P$/p-type $Al_{0.5}In_{0.5}P$ 18-pair DBR layer 47, a p-type AlGaInP intermediate layer 48 having a film thickness of 0.15 μm, a p-type AlGaInP first current diffusion layer 49 having a film thickness of 1 μm, an n-type AlGaInP current constriction layer 50 having a film thickness of 0.3 μm and an n-type GaAs cap layer 51 having a film thickness of 0.01 μm are successively laminated on an n-type GaAs substrate 41 having a surface whose normal line is inclined at an angle of 15° in the [011] direction from the (100) plane by the MOCVD method. It is to be noted that the quantum well active layer 45 has a well layer of $(Al_{0.3}Ga_{0.7})_{0.5}In_{0.5}P$ and a barrier layer of $(Al_{0.5}Ga_{0.5})_{0.5}In_{0.5}P$.

In this case, the n-type AlAs/n-type $Al_{0.7}Ga_{0.3}As$ 70-pair DBR layer 43 and the p-type $(Al_{0.4}Ga_{0.6})_{0.5}In_{0.5}P$/p-type $Al_{0.5}In_{0.5}P$ 18-pair DBR layer 47 are formed so that the reflection spectrum is centered at a wavelength of 570 nm, and a resonator length is adjusted so that the resonance wavelength of the resonator formed of the two DBR layers 43 and 47 becomes 570 nm. In the present embodiment, the resonator length was 1.5 times the wavelength. Further, the quantum well active layer 45 is formed so that the layer is located in the belly position of the standing wave generated in the resonator with the light emission peak wavelength set to 570 nm.

Figure 17:
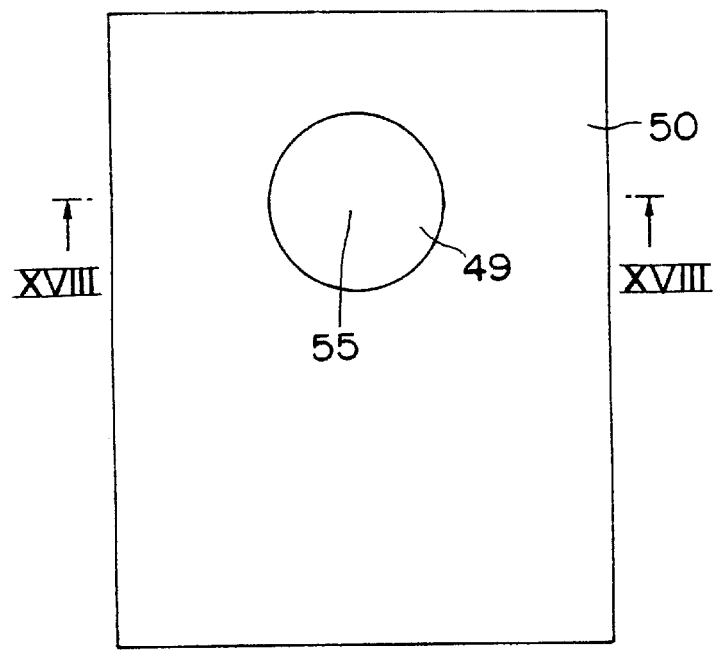
FIG. 17 is a plan view showing a fabricating process subsequent to the process of FIG. 16.
Figure 18:
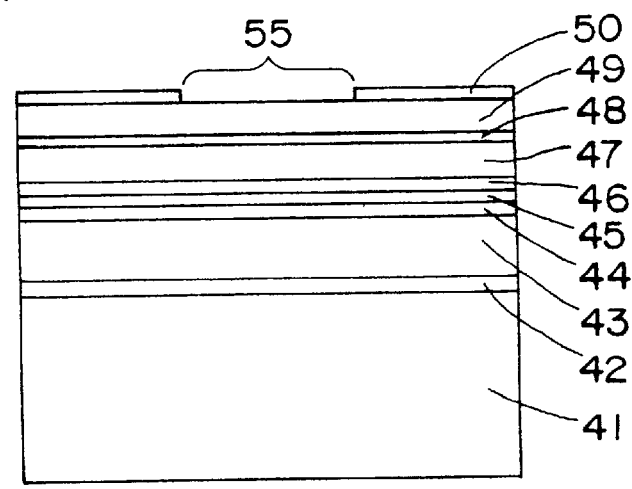
FIG. 18 is a sectional view taken along the arrow line XVIII—XVIII in FIG. 17.

Subsequently, as shown in FIG. 17 and FIG. 18 (sectional view taken along the arrow line XVIII—XVIII in FIG. 17), the n-type GaAs cap layer 51 is removed by a sulfuric acid/hydrogen peroxide based etchant. Thereafter, the n-type AlGaInP current constriction layer 50 is etched until the etching reaches the p-type AlGaInP first current diffusion layer 49 by photolithography and a sulfuric acid/hydrogen peroxide based etchant. By this etching, a circular current path 55 having a diameter of 70 μm is formed.

Figure 19:
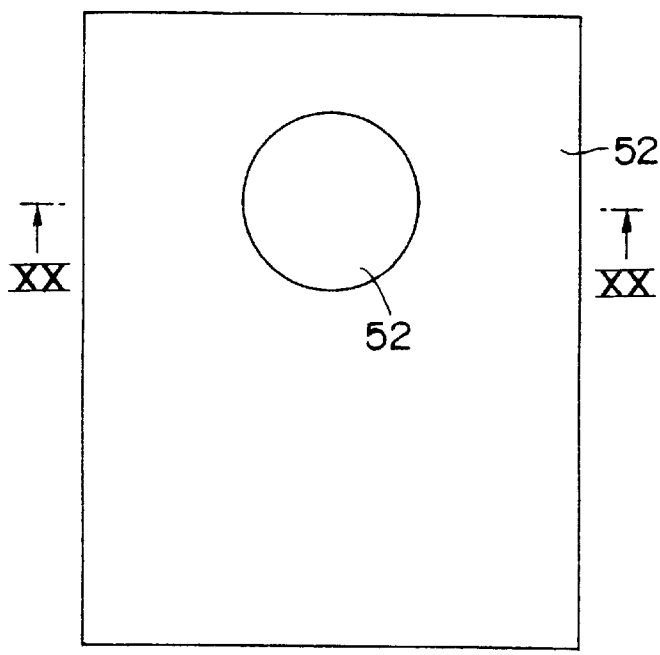
FIG. 19 is a plan view showing a fabricating process subsequent to the process of FIG. 18.
Figure 20:
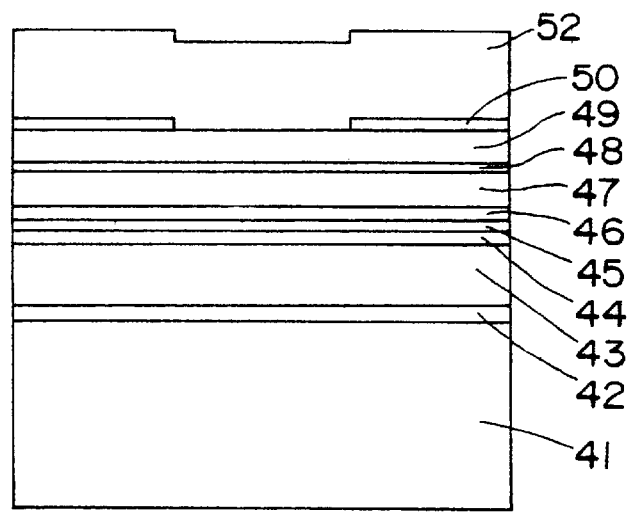
FIG. 20 is a sectional view taken along the arrow line XX—XX in FIG. 19.

Next, as shown in FIG. 19 and FIG. 20 (sectional view taken along the arrow line XX—XX in FIG. 19), a p-type AlGaInP second current diffusion layer 52 having a film thickness of 7 μm is regrown on the n-type AlGaInP current constriction layer 50 and the p-type AlGaInP first current diffusion layer 49.

Subsequently, as shown in FIG. 14 and FIG. 15, AuBe/Au is deposited on the p-type AlGaInP second current diffusion layer 52, and a surface electrode is formed by photolithography and etching with an Au etchant. Then, heat treatment is performed to form a p-type electrode 53. Next, the wafer is scalded in hydrochloric acid at a temperature of 65° C. to 70° C. In this stage, the region that belongs to the surface of the p-type AlGaInP second current diffusion layer 52 and is not provided with the p-type electrode 53 becomes a roughened surface. Further, the n-type GaAs substrate 41 is abraded to a film thickness of about 280 μm, and AuGe/Au is deposited on this abraded surface and subjected to heat treatment to form an n-type electrode 54.

The thus-formed semiconductor light-emitting device does not need the processes of sticking the wafer to a sheet, another substrate or the like, abrading the wafer, thereafter taking out the wafer and cleaning the wafer at all for the purpose of abrading and roughening the wafer surface, by comparison with the second embodiment, allowing the processes to be simplified. It is to be noted that the radiation angle dependency of the emission light wavelength is sufficiently reduced similarly to the first and second embodiments.

The multi-layer reflection film (n-type AlAs/n-type $Al_{0.7}Ga_{0.3}As$ 70-pair DBR layer) 43 located on the n-type GaAs substrate 41 side with respect to the light-emitting layer (quantum well active layer) 45 is formed of an AlGaAs based material. Therefore, the occurrence of warp or a dark line of the n-type GaAs substrate 41 is not observed since a difference in coefficient of thermal expansion with respect to the n-type GaAs substrate 41 is small although the total film thickness is about 7 μm, which is thicker than those of the first and second embodiments. As a result, the number of layers can be increased to 70 pairs, allowing a high reflectance of not lower than 99% to be achieved.

The multi-layer reflection film (p-type $(Al_{0.4}Ga_{0.6})_{0.5}In_{0.5}P$/p-type $Al_{0.5}In_{0.5}P$ 18-pair DBR layer) 47 located on the opposite side of the GaAs substrate 41 with respect to the light-emitting layer (quantum well active layer) 45 is formed of an AlGaInP based material. Accordingly, there is no problem about the moisture resistance, similarly to the first and second embodiments. When an electrification test was performed at a current of 50 mA under the conditions of a temperature of 80° and a humidity of 85%, an optical output of 105% of the initial optical output was yielded even after a lapse of 1000 hours.

An initial optical output of 0.4 mW was provided as a consequence of an about 10% increase in light take-out efficiency due to the dimensional reduction in the area of branch-shaped electrodes 56 located above the light-emitting portion, as compared with the first and second embodiments.

<Fourth Embodiment>

Figure 21:
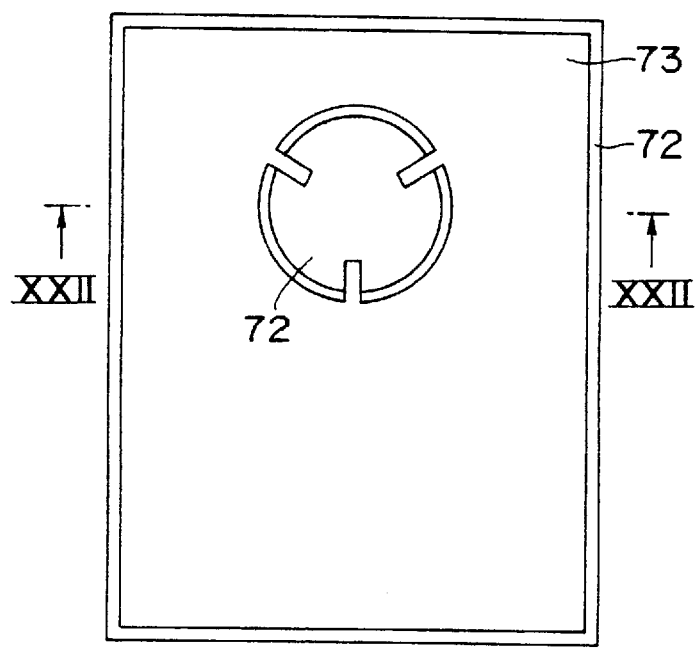
FIG. 21 is a plan view of a semiconductor light-emitting device different from those of FIG. 1, FIG. 8 and FIG. 14.
Figure 22:
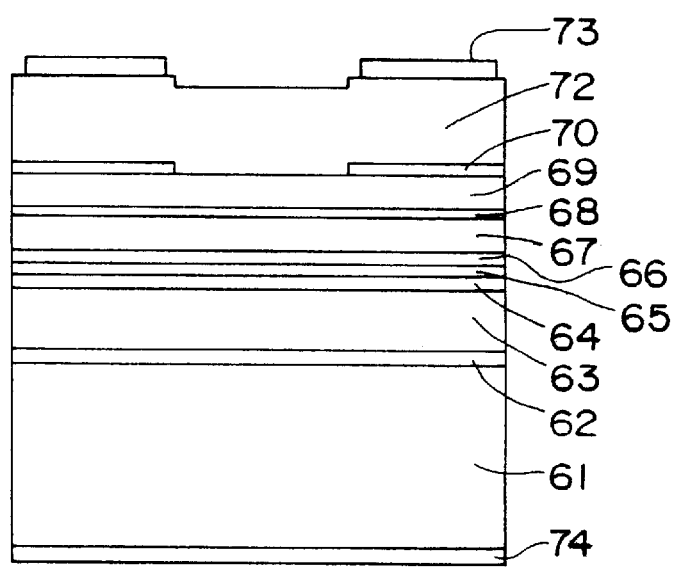
FIG. 22 is a sectional view taken along the arrow line XXII—XXII in FIG. 21.

FIG. 21 is a plan view of a semiconductor light-emitting device of the present embodiment, while FIG. 22 is a sectional view taken along the arrow line XXII—XXII in FIG. 21.

Figure 23:
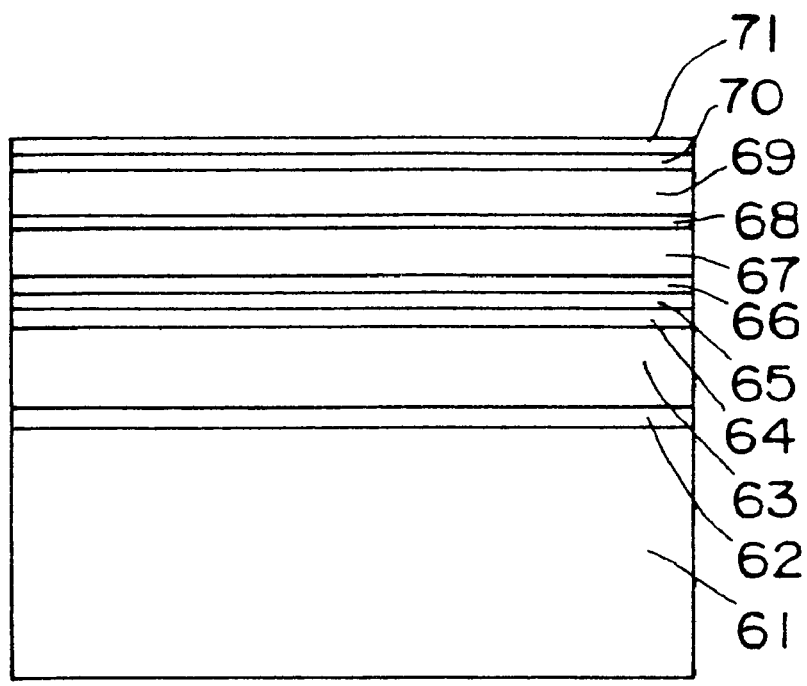
FIG. 23 is a view showing a fabricating process of the semiconductor light-emitting device shown in FIG. 22.

The semiconductor light-emitting device of the present embodiment is based on the AlGaInP system and is formed as follows. As shown in FIG. 23, an n-type GaAs buffer layer 62 having a film thickness of 1 μm, an n-type AlAs/n-type $Al_{0.5}Ga_{0.5}As$ 30-pair DBR layer 63, an n-type $(Al_{0.7}Ga_{0.3})_{0.5}In_{0.5}P$ first clad layer 64, a quantum well active layer 65, a p-type $(Al_{0.7}Ga_{0.3})_{0.5}In_{0.5}P$ second clad layer 66, a p-type $(Al_{0.2}Ga_{0.8})_{0.5}In_{0.5}P$/p-type $Al_{0.5}In_{0.5}P$ 12-pair DBR layer 67, a p-type AlGaInP intermediate layer 68 having a film thickness of 0.15 μm, a p-type $Al_{0.01}Ga_{0.98}In_{0.01}P$ first current diffusion layer 69 having a film thickness of 1 μm, an n-type $Al_{0.01}Ga_{0.98}In_{0.01}P$ current constriction layer 70 having a film thickness of 0.3 μm and an n-type GaAs cap layer 71 having a film thickness of 0.01 μm are successively laminated on an n-type GaAs substrate 61 having a surface whose normal line is inclined at an angle of 15° in the [011] direction from the (100) plane by the MOCVD method. It is to be noted that the quantum well active layer 65 has a well layer of GaInP and a barrier layer of $(Al_{0.5}Ga_{0.5})_{0.5}In_{0.5}P$ In this case, the n-type AlAs/n-type $Al_{0.5}Ga_{0.5}As$ 30-pair DBR layer 63 and the p-type $(Al_{0.2}Ga_{0.8})_{0.5}In_{0.5}P$/p-type $Al_{0.5}In_{0.5}P$ 12-pair DBR layer 67 are formed so that the reflection spectrum is centered at a wavelength of 650 nm, and a resonator length is adjusted so that the resonance wavelength of the resonator formed of the two DBR layers 63 and 67 becomes 650 nm. In the present embodiment, the resonator length was 1.5 times the wavelength. Further, the quantum well active layer 65 is formed so that the layer is located in the belly position of the standing wave generated in the resonator with the light emission peak wavelength set to 650 nm.

Figure 24:
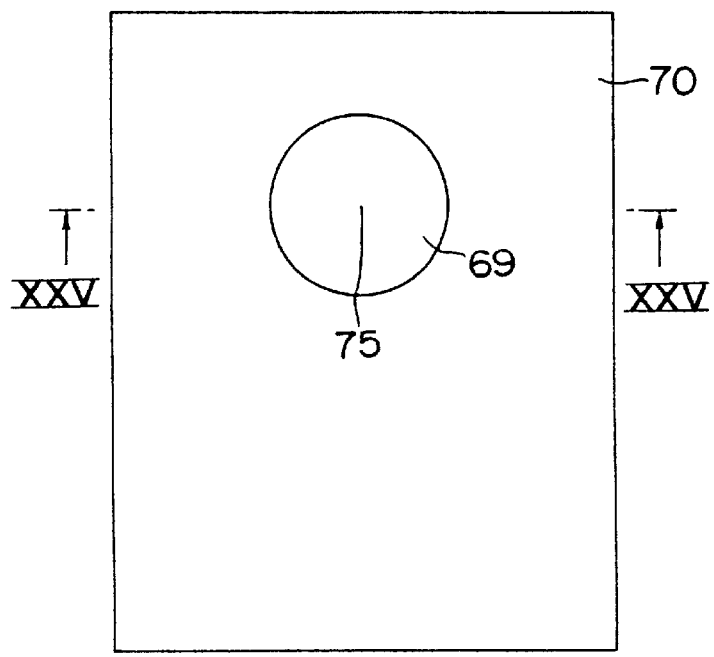
FIG. 24 is a plan view showing a fabricating process subsequent to the process of FIG. 23.
Figure 25:
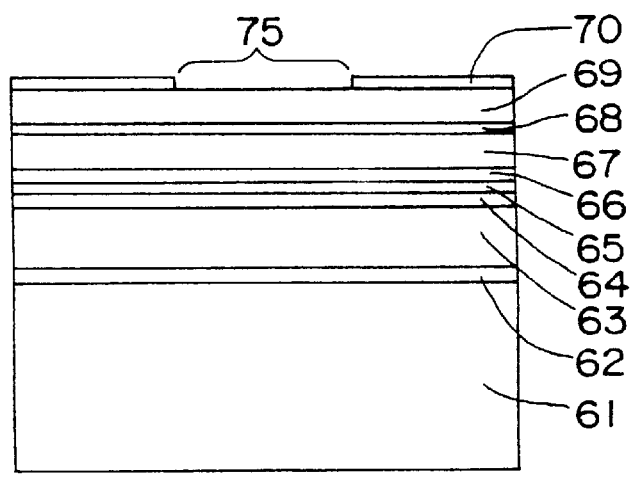
FIG. 25 is a sectional view taken along the arrow line XXV—XXV in FIG. 24.

Subsequently, as shown in FIG. 24 and FIG. 25 (sectional view taken along the arrow line XXV—XXV in FIG. 24), the n-type GaAs cap layer 71 is removed by a sulfuric acid/hydrogen peroxide based etchant. Thereafter, the n-type $Al_{0.01}Ga_{0.98}In_{0.01}P$ current constriction layer 70 is etched until the etching reaches the p-type $Al_{0.01}Ga_{0.98}In_{0.01}P$ first current diffusion layer 69 by photolithography and a sulfuric acid/hydrogen peroxide based etchant. By this etching, a circular current path 75 having a diameter of 70 μm is formed.

Figure 26:
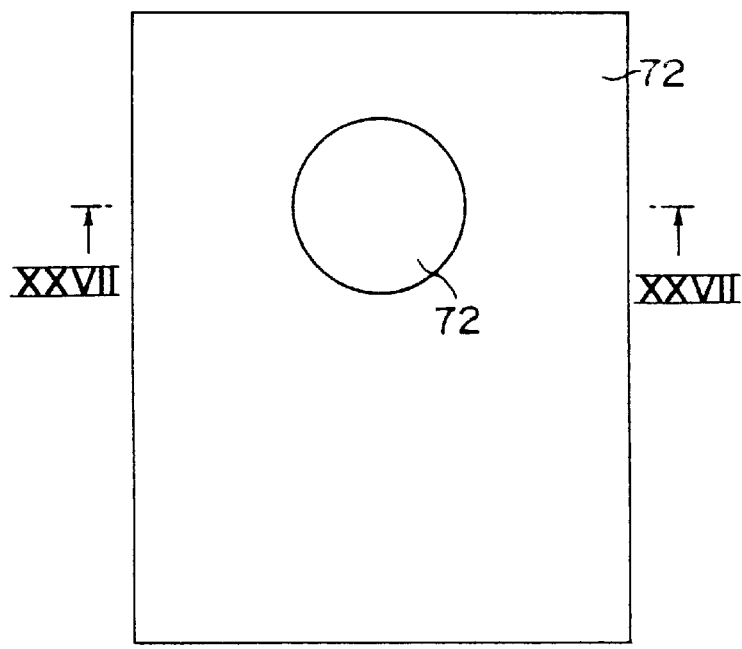
FIG. 26 is a plan view showing a fabricating process subsequent to the process of FIG. 25.
Figure 27:
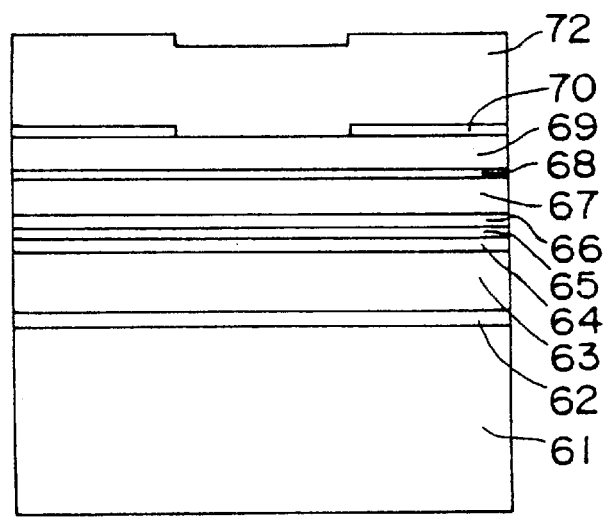
FIG. 27 is a sectional view taken along the arrow line XXVII—XXVII in FIG. 26.

Next, as shown in FIG. 26 and FIG. 27 (sectional view taken along the arrow line XXVII—XXVII in FIG. 26), a p-type $Al_{0.01}Ga_{0.98}In_{0.01}P$ second current diffusion layer 72 having a film thickness of 7 μm is regrown on the n-type $Al_{0.01}Ga_{0.98}In_{0.01}P$ current constriction layer 70 and the p-type $Al_{0.01}Ga_{0.98}In_{0.01}P$ first current diffusion layer 69. In this stage, an $Al_{0.01}Ga_{0.98}In_{0.01}P$ layer that has a lattice constant about 3.6% smaller than that of the n-type GaAs substrate 61 and has a film thickness of about 8 μm is formed on the p-type $(Al_{0.2}Ga_{0.8})_{0.5}In_{0.5}P$/p-type $Al_{0.5}In_{0.5}P$ 12-pair DBR layer 67, and the wafer surface is a roughened surface.

Subsequently, as shown in FIG. 21 and FIG. 22, AuBe/Au is deposited on the p-type $Al_{0.01}Ga_{0.98}In_{0.01}P$ second current diffusion layer 72, and a surface electrode is formed by photolithography and etching with an Au etchant. Then, heat treatment is performed to form a p-type electrode 73. Further, the n-type GaAs substrate 61 is abraded to a film thickness of about 280 μm, and AuGe/Au is deposited on this abraded surface and subjected to heat treatment to form an n-type electrode 74.

Figure 28:
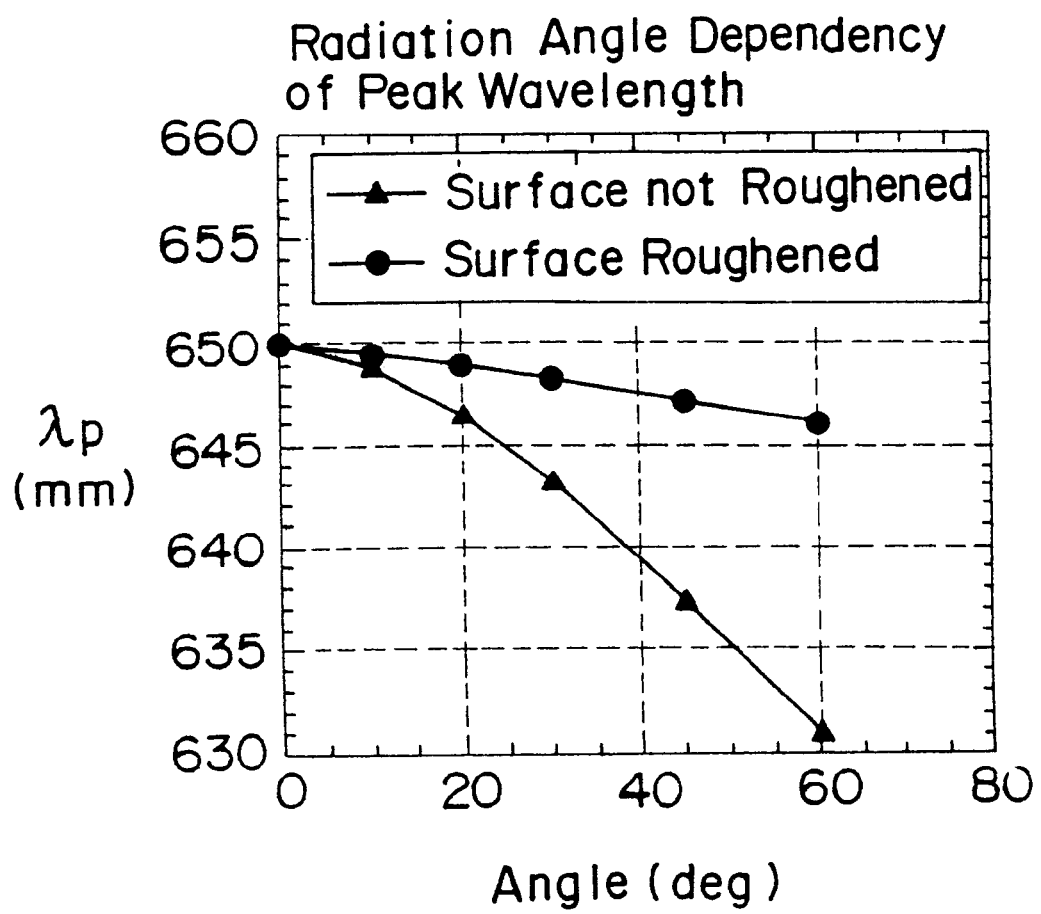
FIG. 28 is a graph showing the radiation angle dependency of the peak wavelength of the semiconductor light-emitting device shown in FIG. 21.

The thus-formed semiconductor light-emitting device does not need the process of separately roughening the wafer surface after crystal growth at all, by comparison with the first through third embodiments, allowing the processes to be simplified. It is to be noted that the radiation angle dependency of the emission light wavelength is slightly greater than the dependency of each of the first through third embodiments, as shown in FIG. 28, since the degree of surface roughening is small. However, the dependency is much smaller than in the case where no surface roughening is performed.

There is, of course, no problem about the moisture resistance. When an electrification test was performed at a current of 50 mA under the conditions of a temperature of 80° and a humidity of 85%, an optical output of 90% of the initial optical output was yielded even after a lapse of 1000 hours. With regard to the initial optical output, a sufficiently high optical output of 1.7 mW was obtained at a current of 20 mA.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light-emitting device comprising:

a resonator including multi-layer reflection films on a GaAs substrate side and a surface side that are formed with interposition of an interval in a direction perpendicular to the GaAs substrate on the GaAs substrate, a light-emitting layer formed in an anti-node position of a standing wave between the multi-layer reflection films, and a semiconductor layer which has one or more layers and an uppermost diffusion layer whose surface comprises roughened means for light diffusing which causes light output from the device to be diffused upon leaving said surface of said uppermost diffusion layer, the semiconductor layer being formed on the multi-layer reflection film located on the opposite side of the GaAs substrate with respect to the light-emitting layer.

2. A semiconductor light-emitting device as claimed in claim 1, wherein the light-emitting layer is constructed of an $Al_yGa_zIn_{1-y-z}P$ ($0 \leq y \leq 1$, $0 \leq z \leq 1$) layer comprised of a single layer or a plurality of layers.

3. A semiconductor light-emitting device as claimed in claim 1, wherein the multi-layer reflection film located on the GaAs substrate side with respect to the light-emitting layer is an $Al_xGa_{1-x}As$ ($0 \leq x \leq 1$) layer, and the multi-layer reflection film located on the opposite side of the GaAs substrate with respect to the light-emitting layer is constructed of an $Al_yGa_zIn_{1-y-z}P$ ($0 \leq y \leq 1$, $0 \leq z \leq 1$) layer.

4. The semiconductor light-emitting device of claim 1, wherein the diffusion layer comprises a light diffusion layer.

5. The semiconductor light-emitting device of claim 1, wherein the diffusion layer comprises a current diffusion layer.

6. A semiconductor light-emitting device comprising:

a resonator including a pair of multi-layer reflection films formed with interposition of an interval on a GaAs inclusive substrate, a light-emitting layer located between the multi-layer reflection films, a semiconductor layer which has one or more layers and an uppermost diffusion layer whose surface is roughened in a light diffusing manner so as to cause light output from the device to be diffused upon leaving said surface of the uppermost diffusion layer, the semiconductor layer being formed on the multi-layer reflection film located on the opposite side of the GaAs substrate with respect to the light-emitting layer, and wherein at least a portion of the roughened surface of the semiconductor layer is exposed so that it is not contacted by any metal film.

7. The semiconductor light-emitting device of claim 6, wherein the diffusion layer comprises a light diffusion layer.

8. The semiconductor light-emitting device of claim 6, wherein the diffusion layer comprises a current diffusion layer.

9. A light emitting device comprising:

a semiconductor substrate;

a resonator including first and second multi-layered reflectors supported by the substrate;

a light emitting layer provided between the first and second multi-layered reflectors;

a semiconductor diffusion layer supported by the substrate, with the reflectors being provided between the substrate and the semiconductor layer, the semiconductor diffusion layer including an uppermost surface which includes a roughened means for causing light output from the device to be diffused upon leaving said roughened means at said uppermost surface of the semiconductor diffusion layer;

a dielectric layer provided on the substrate over the semiconductor layer; and an aperture provided in the dielectric layer, the aperture being located over at least part of the roughened means portion of the semiconductor layer.

10. The device of claim 9, wherein the dielectric layer comprises silicon oxide.

11. The device of claim 9, wherein the roughened means of the semiconductor layer is exposed in the aperture of the dielectric layer, and no metal layer is provided over and contacting at least a portion of the roughened means of the semiconductor layer in the aperture.

* * * * *